US011450699B2

(12) United States Patent
Damghanian et al.

(10) Patent No.: US 11,450,699 B2
(45) Date of Patent: Sep. 20, 2022

(54) IMAGE SENSOR COMPRISING PIXELS FOR PREVENTING OR REDUCING THE CROSSTALK EFFECT

(71) Applicant: InterDigital CE Patent Holdings, SAS, Paris (FR)

(72) Inventors: Mitra Damghanian, Cesson Sevigne (FR); Artem Boriskin, Thorigne-Fouillard (FR); Oksana Shramkova, Cesson-Sevigne (FR); Valter Drazic, Betton (FR); Laurent Blonde, Thorigne-Fouillard (FR)

(73) Assignee: InterDigital CE Patent Holdings, SAS, Paris (FR)

( * ) Notice: Subject to any disclaimer, the term of this patent is extended or adjusted under 35 U.S.C. 154(b) by 130 days.

(21) Appl. No.: 16/651,261

(22) PCT Filed: Aug. 31, 2018

(86) PCT No.: PCT/EP2018/073541
§ 371 (c)(1),
(2) Date: Mar. 26, 2020

(87) PCT Pub. No.: WO2019/063241
PCT Pub. Date: Apr. 4, 2019

(65) Prior Publication Data
US 2020/0295066 A1 Sep. 17, 2020

(30) Foreign Application Priority Data
Sep. 26, 2017 (EP) .................................. 17306274

(51) Int. Cl.
*H01L 31/0232* (2014.01)
*H01L 27/146* (2006.01)

(52) U.S. Cl.
CPC .. *H01L 27/14621* (2013.01); *H01L 27/14627* (2013.01)

(58) Field of Classification Search
None
See application file for complete search history.

(56) References Cited

U.S. PATENT DOCUMENTS

2008/0049126 A1   2/2008  Ford
2008/0265345 A1*  10/2008 Yu .................... H01L 21/28097
                                                              257/E49.001
(Continued)

FOREIGN PATENT DOCUMENTS

EP    1414073 A2    4/2004
EP    2239777 A2    10/2010

OTHER PUBLICATIONS

Lee, Jong-Kwon, et al. "Efficiency enhancement in a backside illuminated 1.12 μm pixel CMOS image sensor via parabolic color filters," Opt. Express 24, 16027-16036 (2016) (10 pages).
(Continued)

*Primary Examiner* — Ali Naraghi
(74) *Attorney, Agent, or Firm* — Invention Mine LLC

(57) ABSTRACT

The present disclosure concerns an image sensor comprising a set of pixels, wherein each pixel of the set comprises a first and a second element, the first element comprising a photodiode module unit, and the second element being an element for filtering color and focusing incident light into said first element. The image sensor further comprises at least two consecutive pixels from the set of pixels, for which first elements are put side by side, and wherein the image sensor comprises a gap between second elements of said at least two consecutive pixels.

18 Claims, 17 Drawing Sheets

(56) References Cited

U.S. PATENT DOCUMENTS

| | | | |
|---|---|---|---|
| 2009/0166518 A1 | 7/2009 | Tay | |
| 2009/0250594 A1* | 10/2009 | Tanaka | H01L 27/14685 |
| | | | 438/70 |
| 2010/0296037 A1* | 11/2010 | Sakai | G02F 1/133634 |
| | | | 349/119 |
| 2014/0231887 A1* | 8/2014 | Chen | H01L 27/146 |
| | | | 438/64 |
| 2017/0365635 A1* | 12/2017 | Yang | H01L 27/14621 |

OTHER PUBLICATIONS

International Search Report and Written Opinion of the International Searching Authority for PCT/EP2018/073541 dated Nov. 16, 2018 (12 pages).

International Preliminary Report on Patentability for PCT/EP2018/073541 dated Mar. 31, 2020 (6 pages).

Cheng, Hua, et al. "Dynamically Tunable Broadband Infrared Anomalous Refraction Based on Graphene Metasurfaces." 2015 (6 pages).

Achouri, Karim, et al. "Metasurface Diffraction Orders Analysis". 2016, pp. 1081-1082. https://ieeexplore.ieee.org/document/7696248 (2 pages).

Chu, Cheng Hung, et al. "Optical response of phase change material for metasurface (Conference Presentation)". In: Proc. SPIE, Optical Data Storage, 2016, vol. 9959, p. 99590E. International Society for Optics and Photonic (2 pages).

Ollanik, Adam, et al. "Highly Efficient, All-Dielectric, Transmissive Gradient Metasurfaces from the Ultraviolet to the Infrared". 2016 Conference on Lasers and Electro-Optics (CLEO), 2016, pp. 1-2 (2 pages).

* cited by examiner

IMAGE SENSOR COMPRISING PIXELS FOR PREVENTING OR REDUCING THE CROSSTALK EFFECT

CROSS-REFERENCE TO RELATED APPLICATIONS

The present application is a national stage application under 35 U.S.C. 371 of International Application No. PCT/EP2018/073541, entitled "IMAGE SENSOR COMPRISING PIXELS FOR PREVENTING OR REDUCING THE CROSSTALK EFFECT", filed on Aug. 31, 2018, which claims benefit from European Patent Application Serial No. 17306274.6, entitled "IMAGE SENSOR COMPRISING PIXELS FOR PREVENTING OR REDUCING THE CROSSTALK EFFECT", filed Sep. 26, 2017, which is hereby incorporated by reference in its entirety.

TECHNICAL FIELD

The present disclosure pertains to the technical field of image sensors for acquiring image data. More precisely, it relates to the design of a specific pixel architecture, and a way to combine several of these pixels within an image sensor.

BACKGROUND

This section is intended to introduce the reader to various aspects of art, which may be related to various aspects of the present invention that are described and/or claimed below. This discussion is believed to be helpful in providing the reader with background information to facilitate a better understanding of the various aspects of the present invention. Accordingly, these statements are to be read in this light, and not as admissions of prior art.

The design of a pixel architecture, and more generally the design of an image sensor is a process in which one skilled in the art should overcome several technical problems.

Indeed, usually, one skilled in art should cope with the crosstalk effect, the pixel size shrinkage limit, the shadowing effect, as well some constraints related to the manufacturing.

More precisely, crosstalk undermines the optical efficiency of an image sensor but it can be considered as a separate problem as minimizing cross talk can be investigated independent from the optical efficiency of the image sensor. Crosstalk is a common issue in the image sensors especially those with small pixels. The higher the thickness of the optical stack, the bigger is the risk for crosstalk. In addition, it should be noted that the crosstalk is by design related to the thickness of the optical stack layer. Moreover, the crosstalk increases especially when there is not a perfect optical insulation between the pixels. The crosstalk issue is more evident at low f-numbers of the main lens.

Concerning the pixel size shrinkage limit, it should be noted that the trend for smaller pixel sizes in the image sensor is slowed down since wavelength and absorption length are constant despite the pixel shrinkage. When the wavelength is comparable with the aperture size of one pixel, diffraction brings on crosstalk, which is a major issue, introducing errors and undermining the light collection efficiency of the pixels. Therefore, techniques for enabling realize such shrinkage capability are required.

Concerning the shadowing effect, it is induced by the micro lenses of the pixels. Indeed, the curved surface of the microlenses, which is the common design in the on-chip optics of the image sensors, has a shadowing effect on neighboring pixels. The shadowing can limit the maximum angle of the incident light as bigger angles will be blocked by the neighboring pixels and therefore light never reaches the intended pixel. The case is more noticeable for wide angle captures, smaller f-numbers and when the radius of curvature of the microlenses on the image sensor are small. Moreover, the shadowing effect can increase crosstalk and reduce optical efficiency.

At last, concerning the fabrication complexity, it should be noted that the realization of the color filters (usually three colors and sometimes white or transparent pixels in addition) in current image sensors requires several coating, lithography and etching steps. This process is expensive and requires very precise alignment techniques. On top of that, the microlens array should be realized with another coating, lithography and thermal treatment sequence. This complex fabrication process can challenge the yield, especially in an array structure like an image sensor, where a few defects can fail the whole device. In general, simpler fabrication processes are desirable as it improves the yield. For example, researchers try to find out simpler processes that can be in the form of a process with less fabrication steps, or a process which replaces critical (error prone, low yield) fabrication steps with those that can afford bigger fabrication tolerances and result in a higher yield. It should be noted that the creation of the optical stack in an image sensor happens at the back-end of line (later stages of the image sensor production line). Therefore, errors in this part of the process are costlier.

For solving the crosstalk issue and bypassing the pixel size shrinkage limit, several techniques have been developed.

Indeed, for overcoming the pixel size shrinkage limit, on-chip optics in image sensors are evolved to realize the possibility for pixel shrinkage (width). However, the trend for smaller pixel sizes in the image sensor is slowed down showing the need for new solutions in the on-chip optics. Currently, the optical stack in the image sensor consists of a microlens for light collection and a color filtering layer (as depicted in FIG. 1) having a total thickness of approximately 1.5 µm.

It should be noted that solutions for reducing the crosstalk effect are much more numerous. This is due to the fact that the crosstalk effect has several sources. It can be of spectral, optical (before electron hole generation), or electrical (after electron hole generation) nature, or a combination of the above. An accepted point is that to suppress crosstalk in the image sensor, the thickness of the pixels should be minimized. Optical stack is one part that contributes to the thickness of the pixels and so increases the risk for crosstalk. The optical stack in the current image sensors include two main layers: a microlens layer and a color filter layer, together with possible buffer and matching layers in between or before and/or after. Currently the optical stack has a typical minimum thickness of 1.5 µm. However, in the absence of methods to reduce the thickness of the pixel, other solution for suppressing crosstalk has been used, including optical and electrical isolations techniques, which are applied in different parts of the structure between pixels in the image sensor.

Some usual practices for isolation between pixels for crosstalk reduction rely on the use of trenches and/or metal grid apertures.

For example, concerning the use of trenches, in BSI ("Back Side illuminated") structures, Deep Trench Insulation (DTI) or full DTI techniques are introduced mostly in the bulk of silicon for electrical and optical isolation purposes (see document US20090200625A1 and document US20060180885A1). However, those trenches cannot prevent crosstalk fully as crosstalk can still happen in the optical stack including the light collection layer (microlenses) and color filtering layer. In current small pixel image sensors with pixel sizes (width) around 1.1 µm, the optical stack (microlens plus color filter layer) has still a thickness about 1.5 µm, which makes the design prone to crosstalk in the optical stack layer.

Another practiced solution for reducing crosstalk relies on the use of metal grid apertures for each pixel (see document U.S. Pat. No. 8,940,574B2). However, metal grids absorb and scatter the incident light, which reduces the efficiency (in term of light acquisition) and cannot provide an efficient optical insulation between the pixels in the optical stack.

Hence, there is a need for a technique that can address these issues.

SUMMARY OF THE DISCLOSURE

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure is directed to an image sensor comprising a set of pixels. Each pixel of the set comprises a first and a second element, the first element comprising a photodiode module unit, and the second element being an element for filtering color and focusing incident light into said first element. The image sensor comprises at least two consecutive pixels from the set of pixels, for which first elements are put side by side, and wherein the image sensor comprises a gap between second elements of said at least two consecutive pixels.

Hence, according to one embodiment of the disclosure, it is proposed to replace the use of the micro lenses and the color filter layer in the architecture of pixels in an image sensor by a structure that achieve the both functions (focusing/guiding of light and the color filtering). In one embodiment of the disclosure, the structures described in PCT patent applications PCT/EP2017/057129 and PCT/EP17/057131 can be used for the choice of the second element, with added color dyes for achieving the color filtering function.

In addition, according to one embodiment of the disclosure, due to the dimensions of the second element, a pixel according to one embodiment of the disclosure has a thinner optical stack.

In one embodiment, the optical stack is implemented using the current image sensor fabrication processes and materials, but the realization of the classical microlens layer and the color filter layer is avoided. Instead, the lithography masks in the realization of the color filter layer are adapted into the design of a second element, and the proper spacing or gap between them is done. Therefore, the color filter functionality and the focusing effect functionality are obtained via a unique element, and not a plurality of elements as in the prior art. Therefore, from a manufacturing point of view, it is easier to fabricate such second element. In addition, it reduces the risk of defects in the manufacturing process.

In another entity, the spacing or gap between the second elements can be filled with a low refractive index dielectric.

In another embodiment, the second elements are implemented using high refractive index dielectric polymer, which contains dye or pigment with proper color properties. Separate lithography steps are used to fabricate each subset of the second elements (one subset for each color).

In another embodiment, the size (width) of the second element is optimized for the wavelength of the only one color it transmits.

In a preferred embodiment, each second element of the image sensor is made of a dielectric material with a complex refractive index of the form of n+jk, which is wavelength dependent.

In a preferred embodiment, each second element substantially only transmits one color among the red, green and blue colors.

In a preferred embodiment, each second element has a height which is defined according to the color it transmits, and dispersion properties of the material of the second element.

In a preferred embodiment, each first element is positioned on a planar layer.

In a preferred embodiment, each first element is positioned on a curved layer.

Therefore, we can use a curved image sensor according to one embodiment of the disclosure.

In a preferred embodiment, the gap has a size up to 700 nm.

In a preferred embodiment, each of the second element comprises a dielectric structure comprising color absorptive dyes that have dispersive properties in a wavelength of interest.

In a preferred embodiment, the dielectric structure has a shape that belongs to a group of shapes comprising:
a cylinder;
a cuboid;
a prism;
a truncated pyramid;
a truncated cone.

In a preferred embodiment, the image sensor is remarkable in that the width of the photodiode module unit is around 1000 nm, and the height of a second element is around $h_r=700$ nm, in the case the second element substantially only transmits the red color, or is around $h_g=1300$ nm in the case the second element substantially only transmits the green color or is around $h_b=1500$ nm in the case the second element substantially only transmits the blue color. In addition, each second element is made of a dielectric material with a complex refractive index of the form of n+jk, a value of n and k being selected from the following table:

| n (real part of the complex refractive index of a second element) | k (imaginary part of the complex refractive index of a second element) |
| --- | --- |
| 1.4 | 0.009 |
| 1.27 | 0.053 |
| 1.4 | 0.073 |
| 1.72 | 0.185 |
| 1.65 | 0.004 |
| 1.53 | 0.079 |
| 1.63 | 0.265 |
| 1.82 | 0.158 |

-continued

| n (real part of the complex refractive index of a second element) | k (imaginary part of the complex refractive index of a second element) |
|---|---|
| 1.7 | 0.028 |
| 4.61 | 0.185 |
| 4.08 | 0.110 |
| 3.78 | 0.095 |
| 2.04 | 0 |

In a preferred embodiment, the image sensor is remarkable in that a width of a second element is comprised between 700 nm to 850 nm.

In a preferred embodiment, the said second elements of said at least two consecutive pixels are at least partially put side by side.

BRIEF DESCRIPTION OF THE DRAWINGS

The above and other aspects of the invention will become more apparent by the following detailed description of exemplary embodiments thereof with reference to the attached drawings in which.

DETAILED DESCRIPTION

Figure 1:
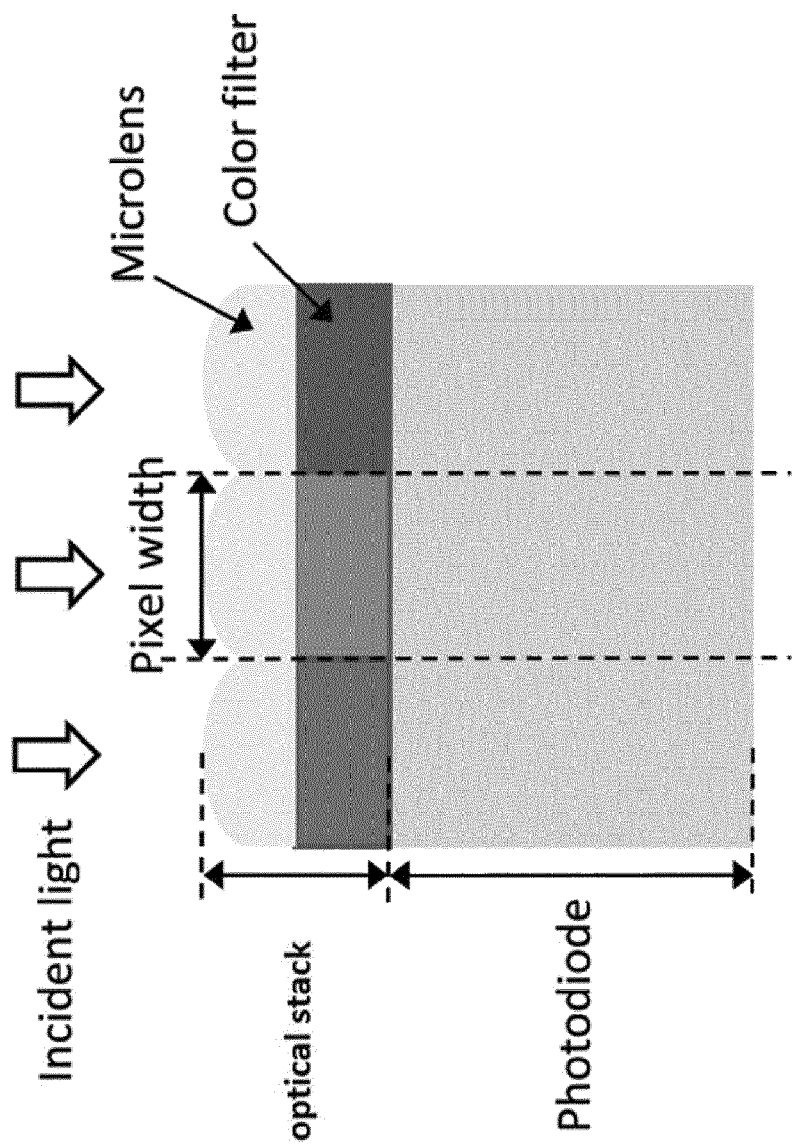
FIG. 1 presents in a schematic way, a cross-section view of several pixels in an image sensor, according to the prior art.

FIG. 1 presents in a schematic way, a cross-section view of several pixels in an image sensor, according to the prior art.

Indeed, conventional pixels usually comprise an optical stack that consist of a microlens and a color filter, that are distinct parts of the optical stack. In addition, conventional pixels also comprise a photodiode unit, which is positioned below the color filter.

Figure 2:
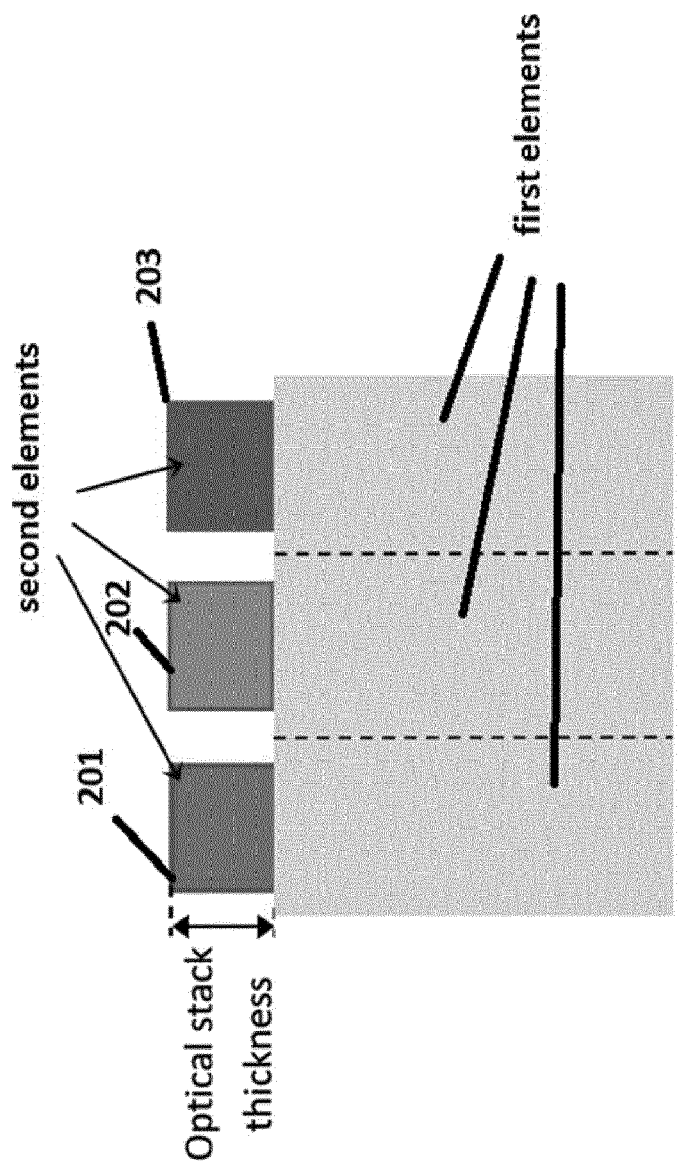
FIG. 2 presents in a schematic way, a cross-section view of several pixels in an image sensor, according to one embodiment of the disclosure.

FIG. 2 presents in a schematic way, a cross-section view of several pixels in an image sensor, according to one embodiment of the disclosure.

According to one embodiment of the disclosure, it is proposed a specific pixel structure for which the optical stack of conventional pixels is replaced by an element that can achieve both the focusing functionality and the color filtering functionality. Such element is made of a dielectric material, and the refractive index of this dielectric element is dependent of the color filtering functionality. Some examples of these dielectric elements (that do not implement the color filtering functionality) are described in the PCT patent applications PCT/EP2017/057129 and PCT/EP17/057131. Hence, such embodiment of the disclosure can reduce the size of the optical stack as described later in this document.

More precisely, according to one embodiment of the disclosure, each pixel comprises a first element (the photodiode unit) and a second element (that can both focus and filter incident light). For example, the second element referenced 201 can focus incident light and substantially only transmits red light. The second element referenced 202 can focus incident light and substantially only transmits green light. At last, the second element referenced 203 can focus incident light and substantially only transmits blue light.

In another embodiment of the disclosure, a second element substantially only transmits either one of the following colors: cyan, magenta, yellow. In another embodiment, the image sensor according to the present disclosure also comprise white pixels. In another embodiment of the disclosure, it is proposed a second element that has filtering properties in other color channels used in image sensor devices.

Figure 3:
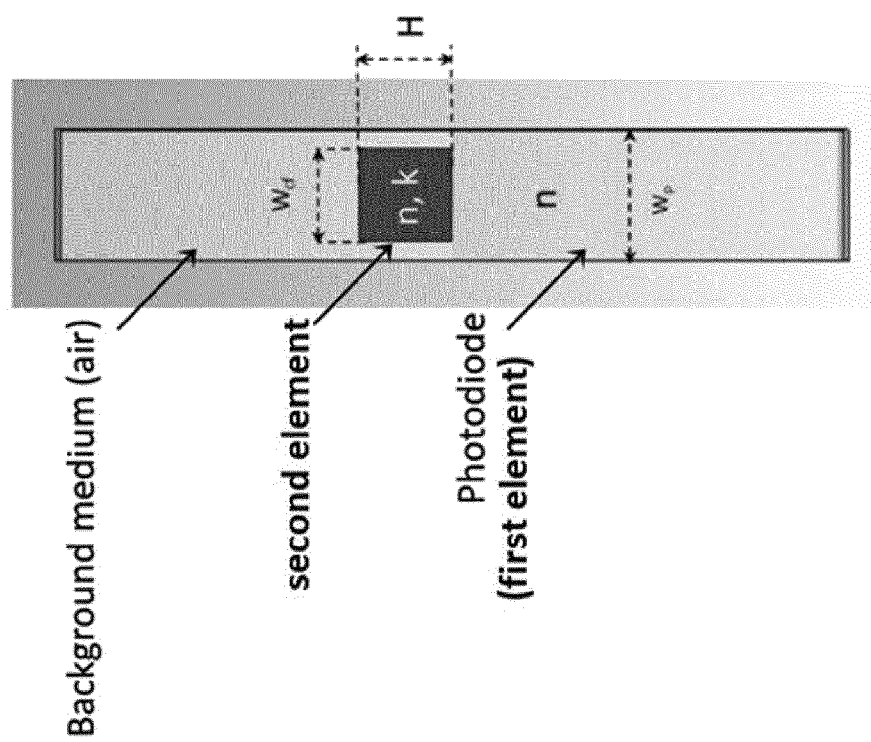
FIG. 3 presents in a schematic way, a cross-section view of one pixel according to one embodiment of the disclosure.

FIG. 3 presents in a schematic way, a cross-section view of one pixel according to one embodiment of the disclosure.

According to one embodiment of the disclosure, a pixel comprises a first element, which is the photodiode unit, that has a width which is noted $W_p$, and also comprises a second element (i.e. the focusing and color filtering element) that can be viewed as a kind of cuboid, that has a height (i.e. a thickness) noted H, and a width noted $W_{cf}$. Such second element is made of a dielectric material that has a complex refractive index value of the form n+jk, where the parameter n corresponds to the real part of the complex refractive index value, and the parameter k corresponds to the imaginary part of the complex refractive index value, which is wavelength dependent. Therefore, the second element provides high absorption for the desired wavelengths. The gap between two second elements of two consecutive pixels according to one embodiment of the disclosure, prevents leakage of light through the optical stack. In one embodiment of the disclosure, it is proposed an image sensor comprising pixels as the one depicted in FIG. 3, that are arranged periodically.

Figure 4:
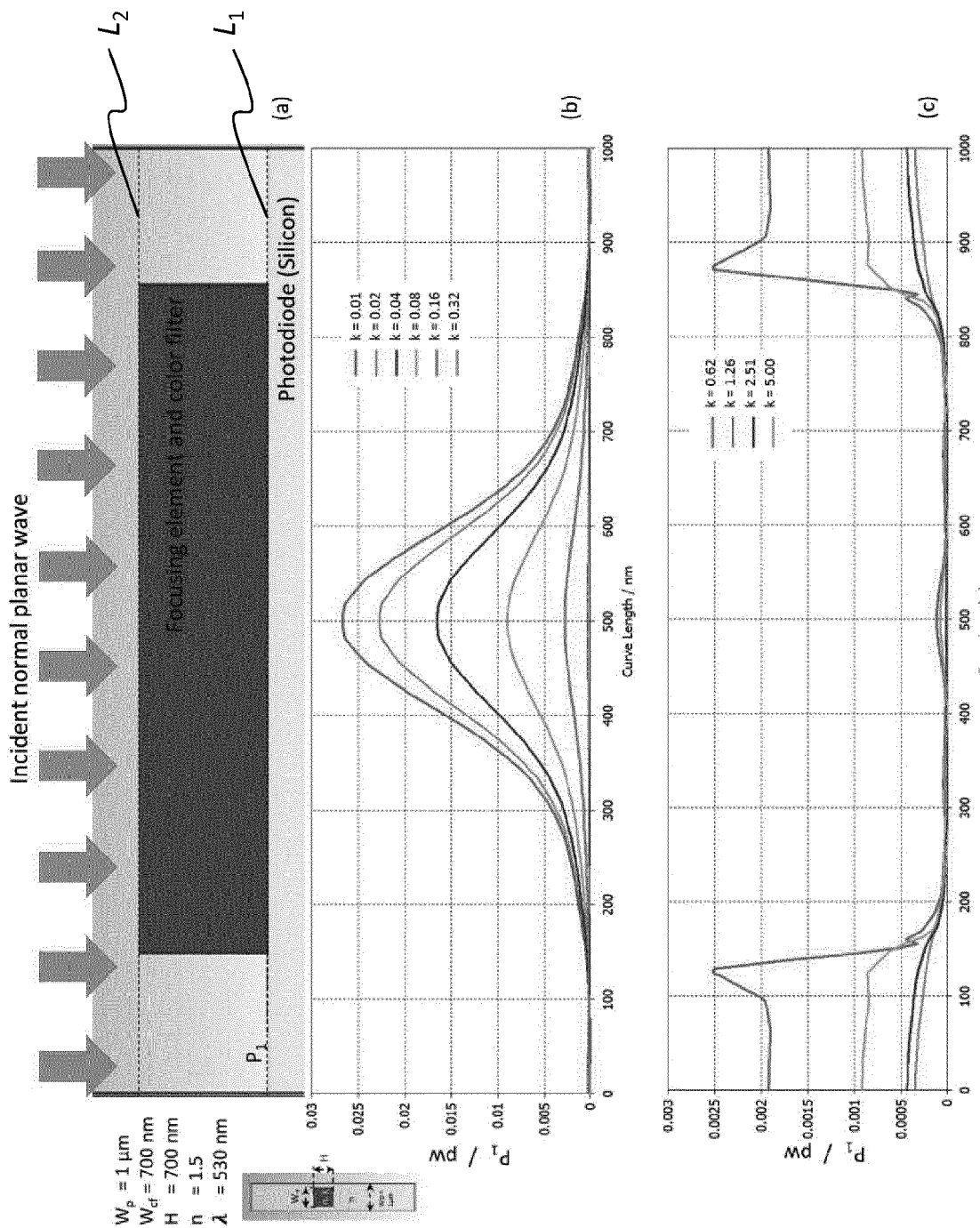
FIG. 4(a) presents a topology of a pixel according to one embodiment of the disclosure (not to scale) that defines a line $l_1$ positioned at the level of the interface between a first element (the photodiode unit) and the second element (corresponding to the light focusing and color filtering element), and where the width $W_{cf}$ of the second element is equal to 700 nm.
FIG. 4(b) presents the power value that reaches the first element, along the line $l_1$, for an incident wavelength of λ=530 nm for different values for the refractive index of the focusing element (of the form 1.5+jk), with k equals to either 0.01 or 0.02 or 0.04, or 0.08, or 0.16, or 0.32.
FIG. 4(c) presents the power value that reaches the first element, along the line $l_1$, for an incident wavelength of λ=530 nm for different values for the refractive index of the focusing element (of the form 1.5+jk) with k equals to either 0.62 or 1.26 or 2.51, or 5.

FIG. 4(a) presents a topology of a pixel according to one embodiment of the disclosure (not to scale) that defines a line $l_1$ positioned at the level of the interface between a first element (the photodiode unit) and the second element (corresponding to the light focusing and color filtering element), and where the width $W_{cf}$ of the second element is equal to 700 nm.

FIG. 4(b) presents the power value repartition, along the line $l_1$, resulting from the incidence of an electromagnetic wave with a wavelength $\lambda=530$ nm for different values for the refractive index of the focusing element (of the form 1.5+1*k), with k equal to either 0.01 or 0.02 or 0.04, or 0.08, or 0.16, or 0.32. It appears that the smaller the parameter k is, the higher the power intensity is at the center of the interface level.

FIG. 4(c) presents the power value repartition, along the line $l_1$, for an incident wavelength of $\lambda=530$ nm for different values for the refractive index of the focusing element (of the form 1.5+1*k) with k equals to either 0.62 or 1.26 or 2.51, or 5. It appears that the when the parameter k is high, the power intensity is higher at the interface level, but outside the second element.

Figure 5:
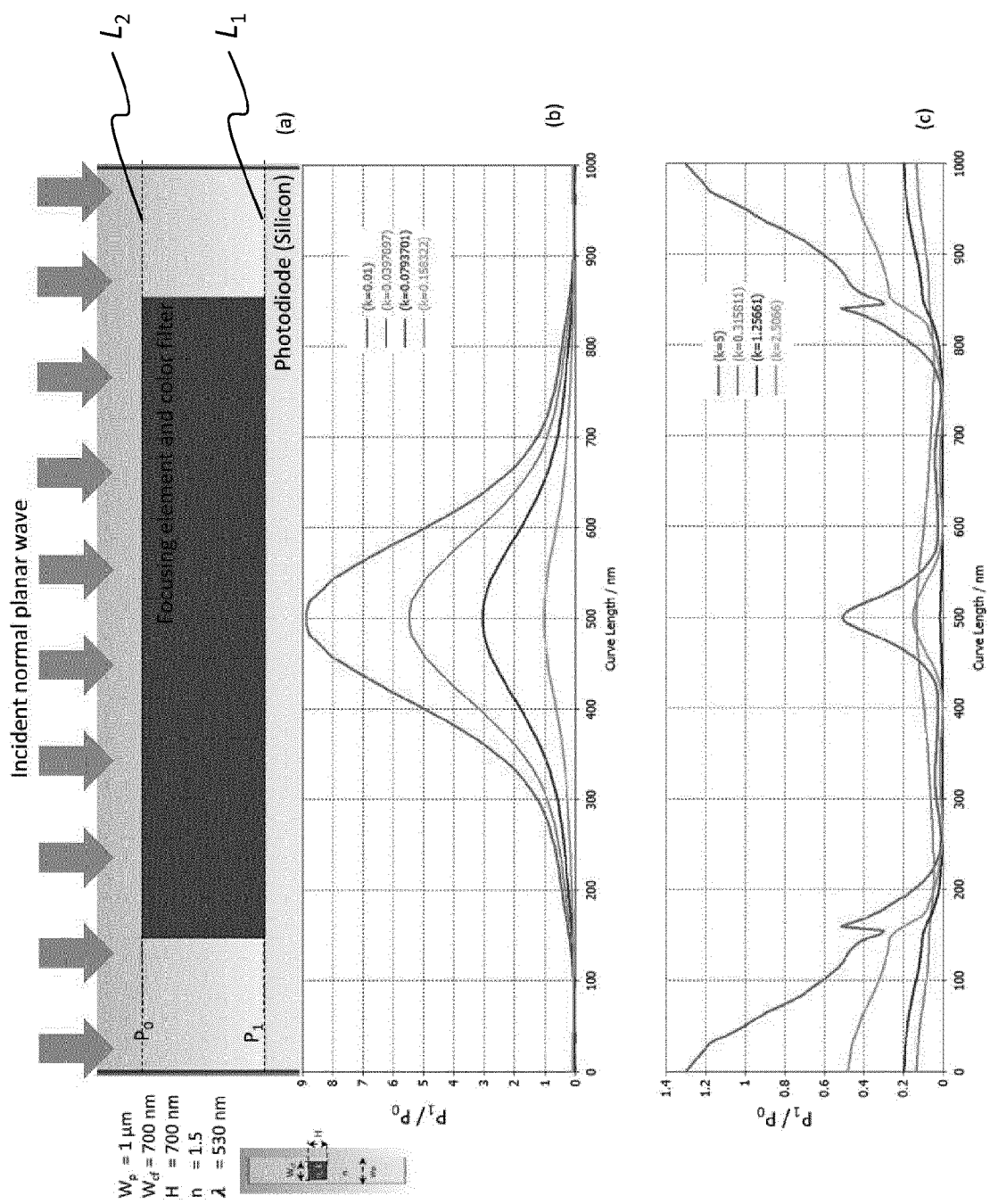
FIG. 5(a) presents a topology of a pixel according to one embodiment of the disclosure (not to scale) that defines a first line $l_1$ located at the level of the interface between a first element (the photodiode unit) and the second element (corresponding to the light focusing and color filtering element), and also defines a second line $l_2$ located at the level of the top surface of the second element, and where the width $W_{cf}$ of the second element is equal to 700 nm.
FIG. 5(b) presents the values of ratio of power in the corresponding points of $l_1$ and $l_2$, for an incident wavelength of λ=530 nm for different values for the refractive index of the focusing element (of the form 1.5+jk) with k equals to either 0.01 or 0.0397897 or 0.0793701, or 0.158322.
FIG. 5(c) presents the ratio of power values in the corresponding points of Ii and $l_2$ for an incident wavelength of λ=530 nm for different values for the refractive index of the focusing element (of the form 1.5+jk) with k equals to either 0.315811 or 1.25661 or 2.5066, or 5.

FIG. 5(a) presents a topology of a pixel according to one embodiment of the disclosure (not to scale) that defines a first line $l_1$ located at the level of the interface between a first element (the photodiode unit) and the second element (corresponding to the light focusing and color filtering element), and also defines a second line $l_2$ located at the level of the top surface of the second element, and where the width $W_{cf}$ of the second element is equal to 700 nm.

It should be noted that the first element has a width $W_p$ equal to 1000 nm, and the second element has a height H equal to 700 nm. Furthermore, the second element has a complex refractive index of the form 1.5+j*k.

FIG. 5(b) presents the values of ratio of power in the corresponding points of $l_1$ and $l_2$, for an incident wavelength of $\lambda=530$ nm for different values for the refractive index of the focusing element (of the form 1.5+jk) with k equals to either 0.01 or 0.0397897 or 0.0793701, or 0.158322.

FIG. 5(c) presents the ratio of power values in the corresponding points of Ii and $l_2$ for an incident wavelength of $\lambda=530$ nm for different values for the refractive index of the focusing element (of the form 1.5+jk) with k equals to either 0.315811 or 1.25661 or 2.5066, or 5.

Figure 6:
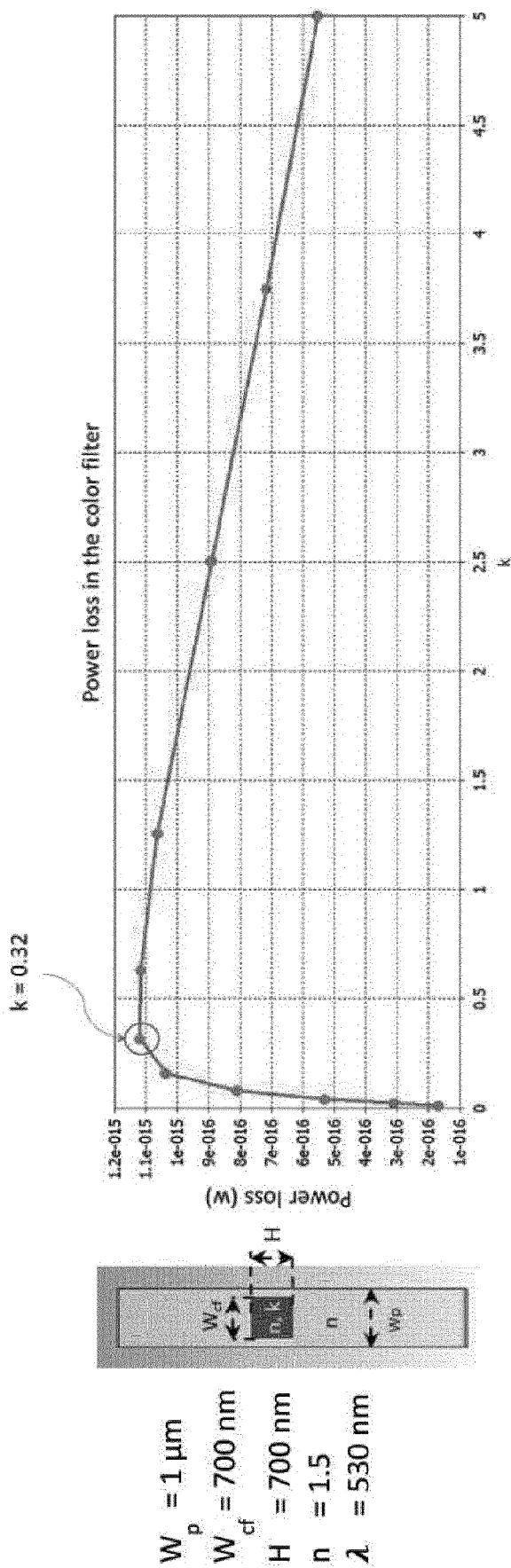
FIG. 6 presents the link between the value of k (partially defining the refractive index of the second element) and the power loss from the second element, according to one embodiment of the disclosure when the parameter $W_{cf}$, defining the width of the second element, is equal to 700 nm.

FIG. 6 presents the link between the value of k (partially defining the refractive index of the second element) and the power loss from the second element, according to one embodiment of the disclosure when the parameter $W_{cf}$, defining the width of the second element, is equal to 700 nm.

More precisely, FIG. 6 shows the total optical loss (power absorption) in the color filter for different values of parameter k. We can see that there is a point (k=0.32) with maximum loss (absorption) in the color filter, which gives a minimum level of leakage (see FIG. 4(b) for=0.32) as well, which is the desired behavior for a color filter element.

Figure 7:
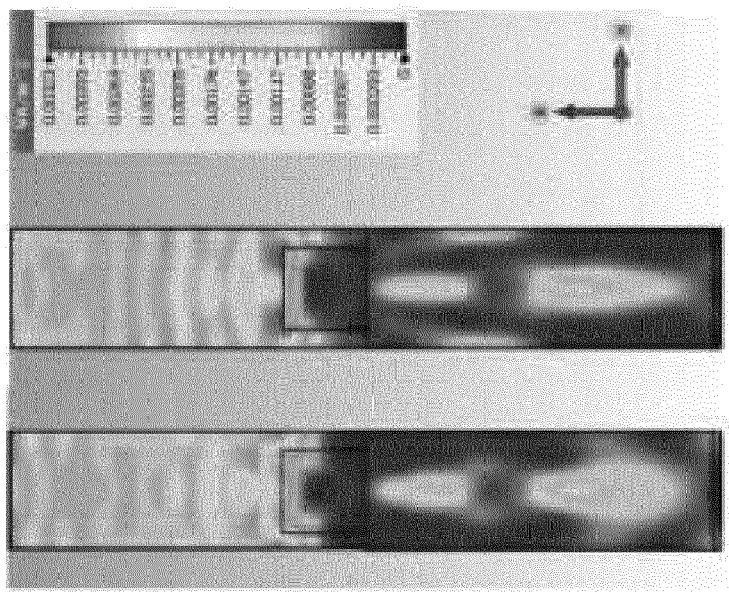
FIG. 7 presents the power flow in a pixel structure according to one embodiment of the disclosure, that is illumined by two kinds of electromagnetic waves.

FIG. 7 presents the power flow in a pixel structure according to one embodiment of the disclosure, that is illuminated by two kinds of electromagnetic waves (i.e. TE (transverse-electric) and TM (transverse-magnetic) electromagnetic waves).

Here, a 2D model is considered with the structure being infinite along y-axis.

More precisely, FIG. 7 shows the power flow in a pixel structure with cuboid lens-color-filter element, for both TE and TM polarizations. The figure shows that the focusing effect is valid for both polarization conditions.

Figure 8:
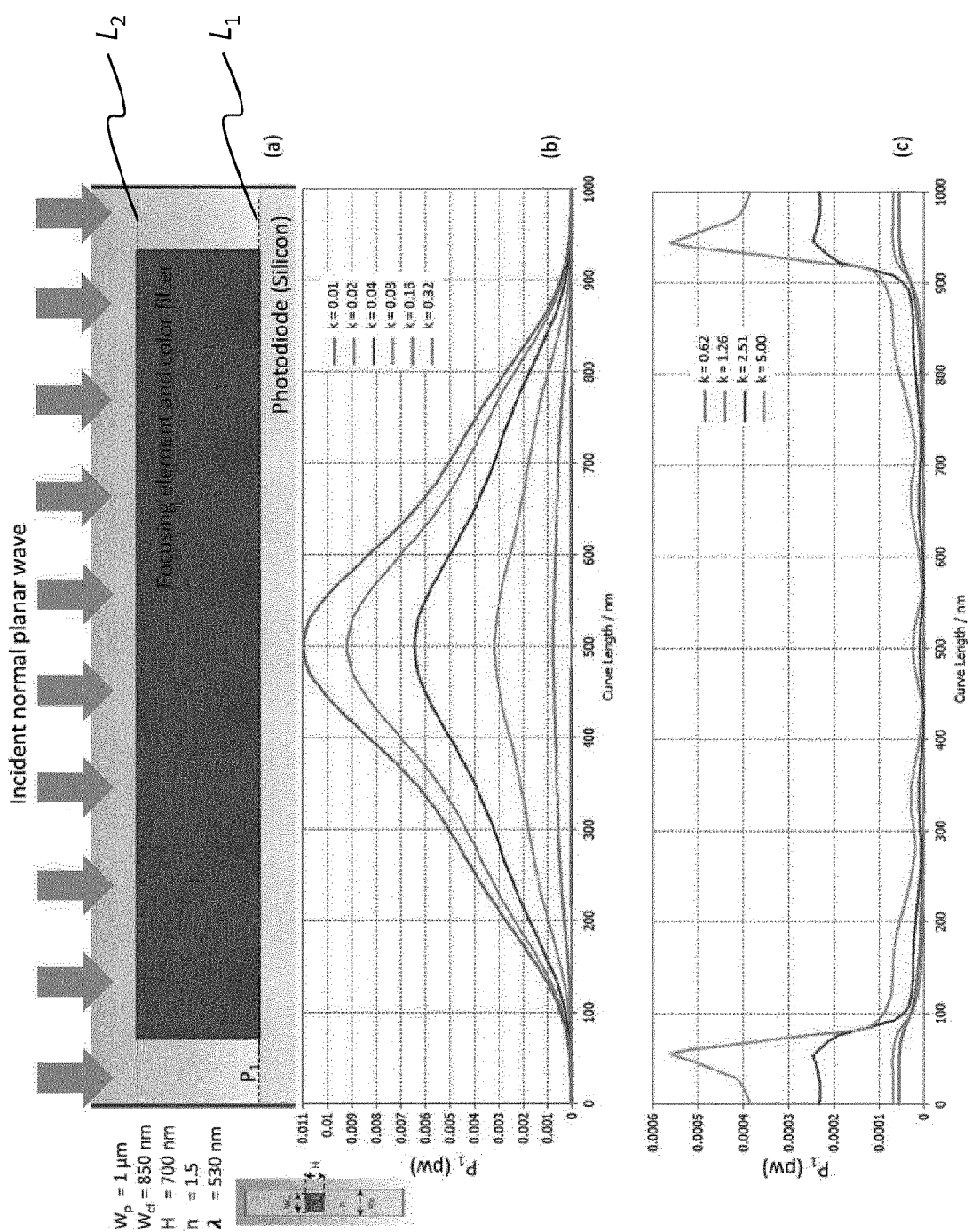
FIG. 8(a) presents a topology of a pixel according to one embodiment of the disclosure (not to scale) that defines a line $l_1$ positioned at the level of the interface between a first element (the photodiode unit) and the second element (corresponding to the light focusing and color filtering element), and where the width $W_{cf}$ of the second element is equal to 850 nm.
FIG. 8(b) presents the power value that reaches the first element, along the line $l_1$, for an incident wavelength of λ=530 nm for different values for the refractive index of the focusing element (of the form 1.5+jk), with k equals to either 0.01 or 0.02 or 0.04, or 0.08, or 0.16, or 0.32.
FIG. 8(c) presents the power value that reaches the first element, along the line $l_1$, for an incident wavelength of λ=530 nm for different values for the refractive index of the focusing element (of the form 1.5+jk) with k equals to either 0.62 or 1.26 or 2.51, or 5.

FIG. 8(a) presents a topology of a pixel according to one embodiment of the disclosure (not to scale) that defines a line $l_1$ positioned at the level of the interface between a first element (the photodiode unit) and the second element (corresponding to the light focusing and color filtering element), and where the width $W_{cf}$ of the second element is equal to 850 nm.

It should be noted that the first element has a width $W_P$ equal to 1000 nm, and the second element has a height H equal to 700 nm. Furthermore, the second element has a complex refractive index of the form 1.5+j*k.

FIG. 8(b) presents the power value that reaches the first element, along the line $l_1$, for an incident wavelength of λ=530 nm for different values for the refractive index of the focusing element (of the form 1.5+jk), with k equals to either 0.01 or 0.02 or 0.04, or 0.08, or 0.16, or 0.32. Here again, as for the case where $W_{cf}$=700 nm, it appears that the smaller the parameter k is, the higher the power intensity is at the center of the interface level.

FIG. 8(c) presents the power value that reaches the first element, along the line $l_1$, for an incident wavelength of λ=530 nm for different values for the refractive index of the focusing element (of the form 1.5+jk) with k equals to either 0.62 or 1.26 or 2.51, or 5.

Here again, it appears that the when the parameter k is high, the power intensity is higher at the interface level, but outside the second element.

Figure 9:
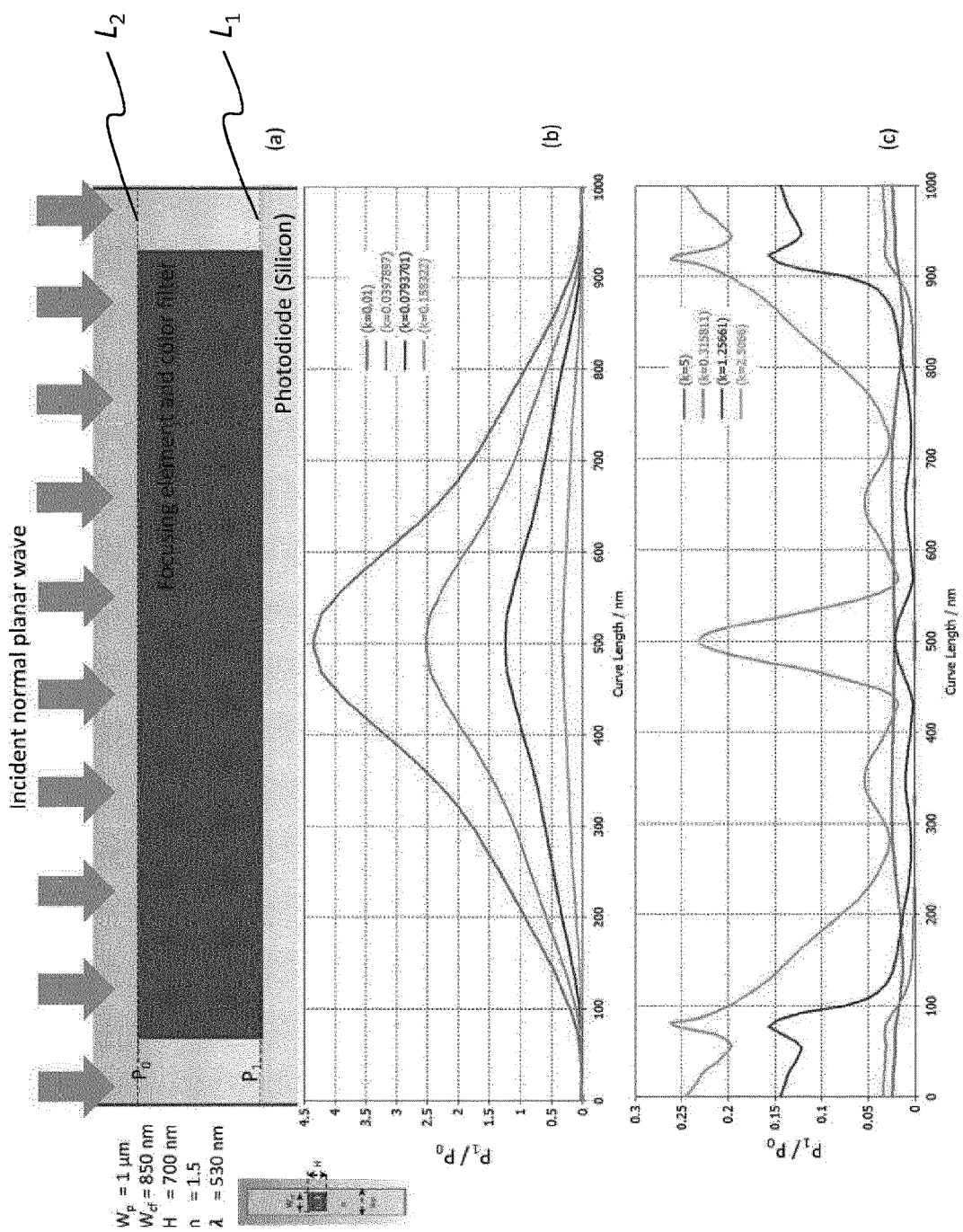
FIG. 9(a) presents a topology of a pixel according to one embodiment of the disclosure (not to scale) that defines a first line $l_1$ located at the level of the interface between a first element (the photodiode unit) and the second element (corresponding to the light focusing and color filtering element), the first line $l_1$ comprising a set of points mentioned as $P_1$, and also defines a second line $l_2$ located at the level of the top surface of the second element, the second line $l_2$ comprising a set of points mentioned as $P_0$.
FIG. 9(b) presents the values of ratio of power in the corresponding points of $l_1$ and $l_2$, for an incident wavelength of λ=530 nm for different values for the refractive index of the focusing element (of the form 1.5+jk) with k equals to either 0.01 or 0.0397897 or 0.0793701, or 0.158322.
FIG. 9(c) presents the values of ratio of power in the corresponding points of $l_1$ and $l_2$, for an incident wavelength of λ=530 nm for different values for the refractive index of the focusing element (of the form 1.5+jk) with k equals to either 0.315811 or 1.25661 or 2.5066, or 5.

FIG. 9(a) presents a topology of a pixel according to one embodiment of the disclosure (not to scale) that defines a first line $l_1$ located at the level of the interface between a first element (the photodiode unit) and the second element (corresponding to the light focusing and color filtering element), and also defines a second line $l_2$ at the top surface of the second element.

FIG. 9(b) presents the values of ratio of power in the corresponding points of $l_1$ and $l_2$, for an incident wavelength of λ=530 nm for different values for the refractive index of the focusing element (of the form 1.5+jk) with k equals to either 0.01 or 0.0397897 or 0.0793701, or 0.158322.

FIG. 9(c) presents the values of ratio of power in the corresponding points of $l_1$ and $l_2$, for an incident wavelength of λ=530 nm for different values for the refractive index of the focusing element (of the form 1.5+jk) with k equals to either 0.315811 or 1.25661 or 2.5066, or 5.

Figure 10:
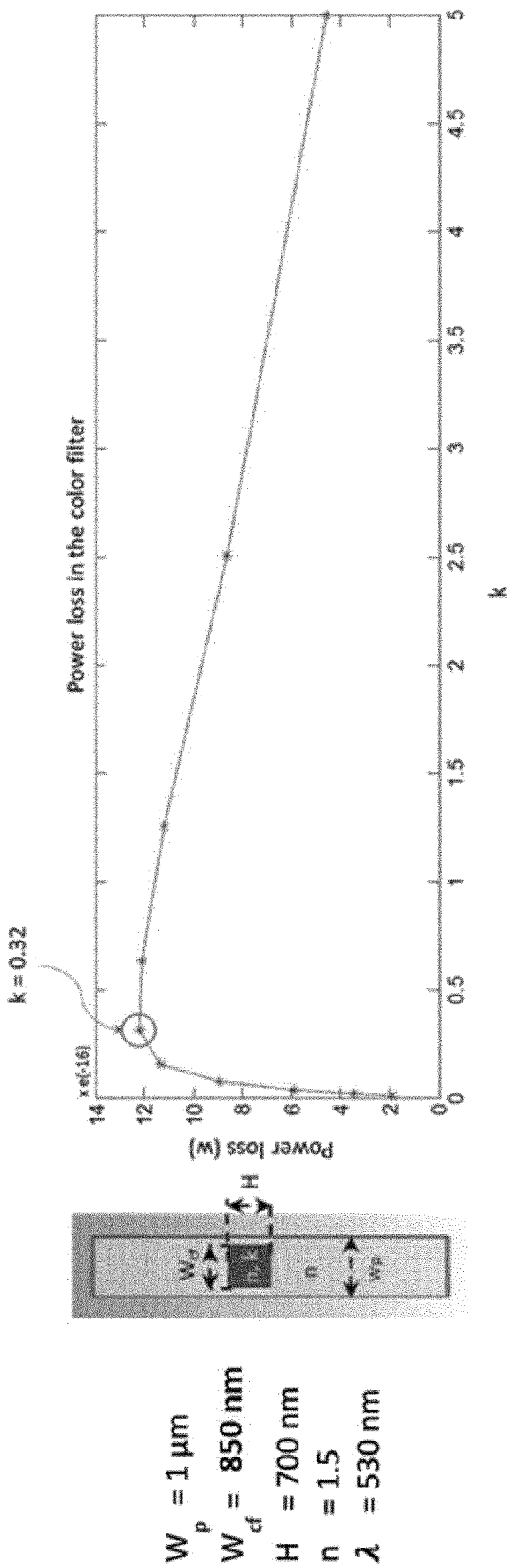
FIG. 10 presents the link between the value of k (partially defining the refractive index of the second element) and the power loss from the second element, according to one embodiment of the disclosure, when the parameter $W_{cf}$, defining the width of the second element, is equal to 850 nm.

FIG. 10 presents the link between the value of k (partially defining the refractive index of the second element) and the power loss from the second element, according to one embodiment of the disclosure, when the parameter $W_{cf}$, defining the width of the second element, is equal to 850 nm.

Here again, as for FIG. 6, we can observe the total optical loss (power absorption) in the color filter for different values of parameter k. We can see that there is a point (k=0.32) with maximum loss (absorption) in the color filter, which gives a minimum level of leakage (see FIG. 8(b) for=0.32) as well, which is the desired behavior for a color filter element.

Therefore, from the analysis of FIGS. 4 to 10, it appears that it can be possible to select some specific values for the refractive index, with some specific dimensions (especially for the second element) for obtaining the following properties:

a high absorption (in term of color absorption) for the second element;

low leakage of the incident light through the gap between the second elements;

a focusing effect for the second element.

Figure 11:
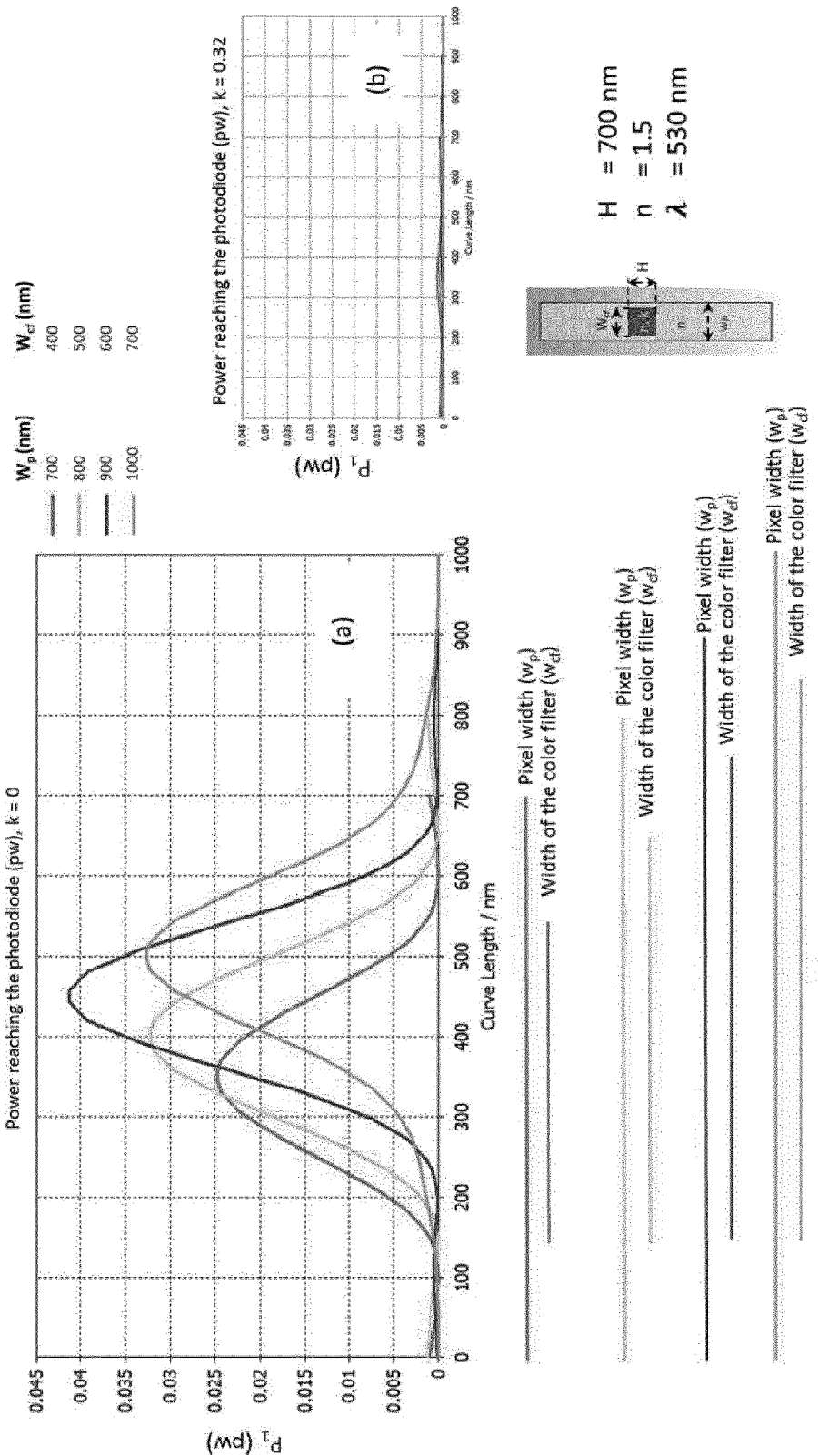
FIG. 11(a) presents the repartition of the power value that reaches the first element of a pixel according to one embodiment of the disclosure, along a line positioned at the interface level with the second element, for an incident wavelength λ=530 nm, for different values of the width $W_P$ of the first element and different values of the width $W_{cf}$ of the second element, with a refractive index of the second element being equal to 1.5 (i.e. k equals to 0)
FIG. 11(b) presents the repartition of the power value that reaches the first element of a pixel according to one embodiment of the disclosure, along a line positioned at the interface level with the second element, for an incident wavelength λ=530 nm, for different values of the width $W_P$ of the first element and different values of the width $W_{cf}$ of the second element, with a refractive index of the second element being equal to 1.5+j*0.32 (i.e. k equals to 0.32)
FIG. 11(c) illustrates the difference of size between the width of the first element and the width of the second element.

FIG. 11(a) presents the repartition of the power value that reaches the first element of a pixel according to one embodiment of the disclosure, along a line positioned at the interface level with the second element, for an incident wavelength λ=530 nm, for different values of the width $W_p$ of the first element and different values of the width $W_{cf}$ of the second element, with a refractive index of the second element being equal to 1.5 (i.e. k equals to 0).

FIG. 11(b) presents the repartition of the power value that reaches the first element of a pixel according to one embodiment of the disclosure, along a line positioned at the interface level with the second element, for an incident wavelength λ=530 nm, for different values of the width $W_p$ of the first element and different values of the width $W_{cf}$ of the second element, with a refractive index of the second element being equal to 1.5+j*0.32 (i.e. k equals to 0.32).

More precisely, FIG. 11(b) shows that the power is almost zero for the chosen value of k (and different values of width).

FIG. 11(c) illustrates the difference of size between the width of the first element and the width of the second element.

Hence, FIGS. 11(a)-(c) show that the proposed technique is scalable to smaller pixel sizes (smaller that 1000 nm). These figures also show the high absorption properties in the second element, the low leakage that occurs outside the second element (in the gap between two consecutive second elements) and a pronounced focusing effect for pixel widths equal to $W_p$=700, 800, 900 and 1000 nm, with respective to width of the second element $W_{cf}$=400, 500, 600 and 700 nm. This shows feasibility of the present technique in the sub-micron pixel sizes. Other geometry combinations of the pixel size, second element width and height (thickness) can be obtained in an optimization process.

Figure 12:
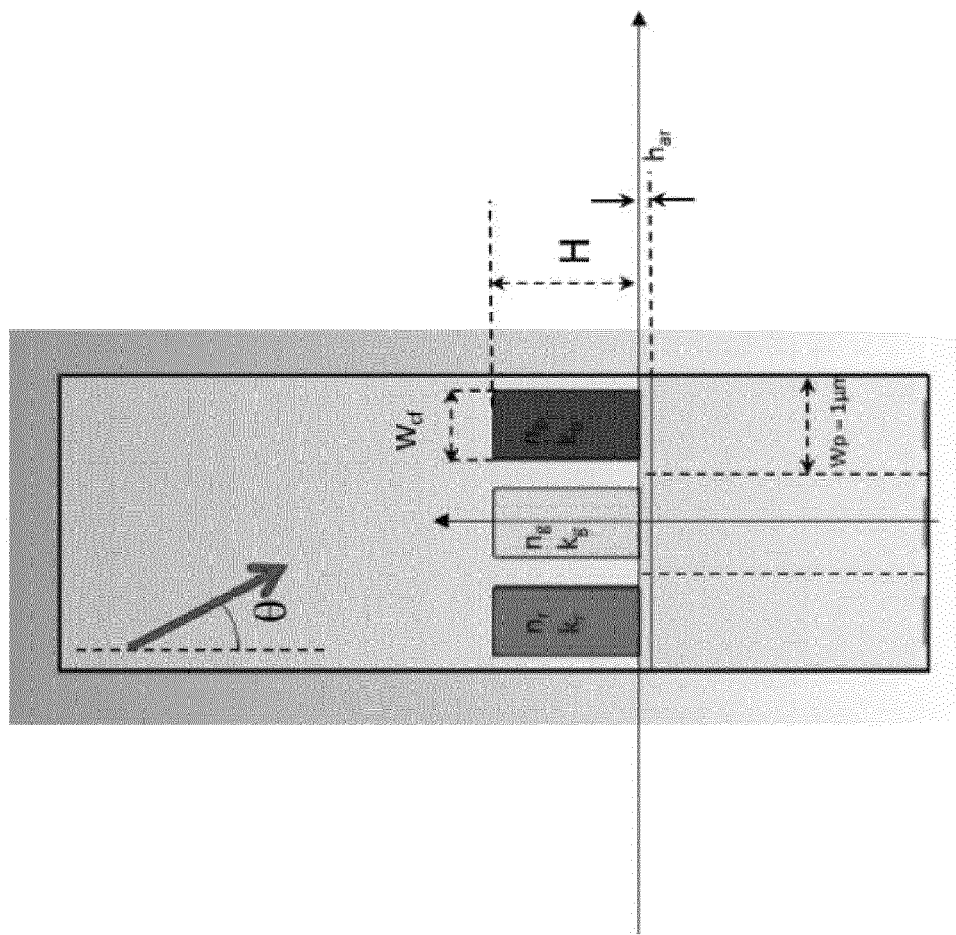
FIG. 12 presents several pixels according to one embodiment of the disclosure, wherein the width of the second elements and the refractive indexes of the second elements are defined according to the color they transmit.

FIG. 12 presents several pixels according to one embodiment of the disclosure, wherein the width of the second elements and the refractive indexes of the second elements are defined according to the color they transmit.

More precisely, in one embodiment of the disclosure, the thickness (height) of a second element for different pixels is assumed to be equal. Material properties $n_i$ (real part of the complex refractive index of a second element), $k_i$ (imaginary part of the complex refractive index of a second element) for i=r (red color), g (green color) and b (blue color), and Si and SiNx, which are used for implementing this model in the software CST (Computer Simulation Technologies) Studio are taken from the article entitled: "*Efficiency enhancement in a backside illuminated 1.12 μm pixel CMOS image sensor via parabolic color filters.*" by Lee, Jong-Kwon, et al., published in Optics express 24.14 (2016): 16027-16036, and are shown in the following table:

| Material for second element | Wave-length (nm) | n (real part of the complex refractive index of the second element) | k (imaginary part of the complex refractive index of the second element) |
| --- | --- | --- | --- |
| B color filter | 450 | 1.4 | 0.009 |
| | 530 | 1.27 | 0.053 |
| | 620 | 1.4 | 0.073 |
| G color filter | 450 | 1.72 | 0.185 |
| | 530 | 1.65 | 0.004 |
| | 620 | 1.53 | 0.079 |
| R Color filter | 450 | 1.63 | 0.265 |
| | 530 | 1.82 | 0.158 |
| | 620 | 1.7 | 0.028 |
| Si | 450 | 4.61 | 0.185 |
| | 530 | 4.08 | 0.110 |
| | 620 | 3.78 | 0.095 |
| $SiN_x$ | All | 2.04 | 0 |

Figure 13:
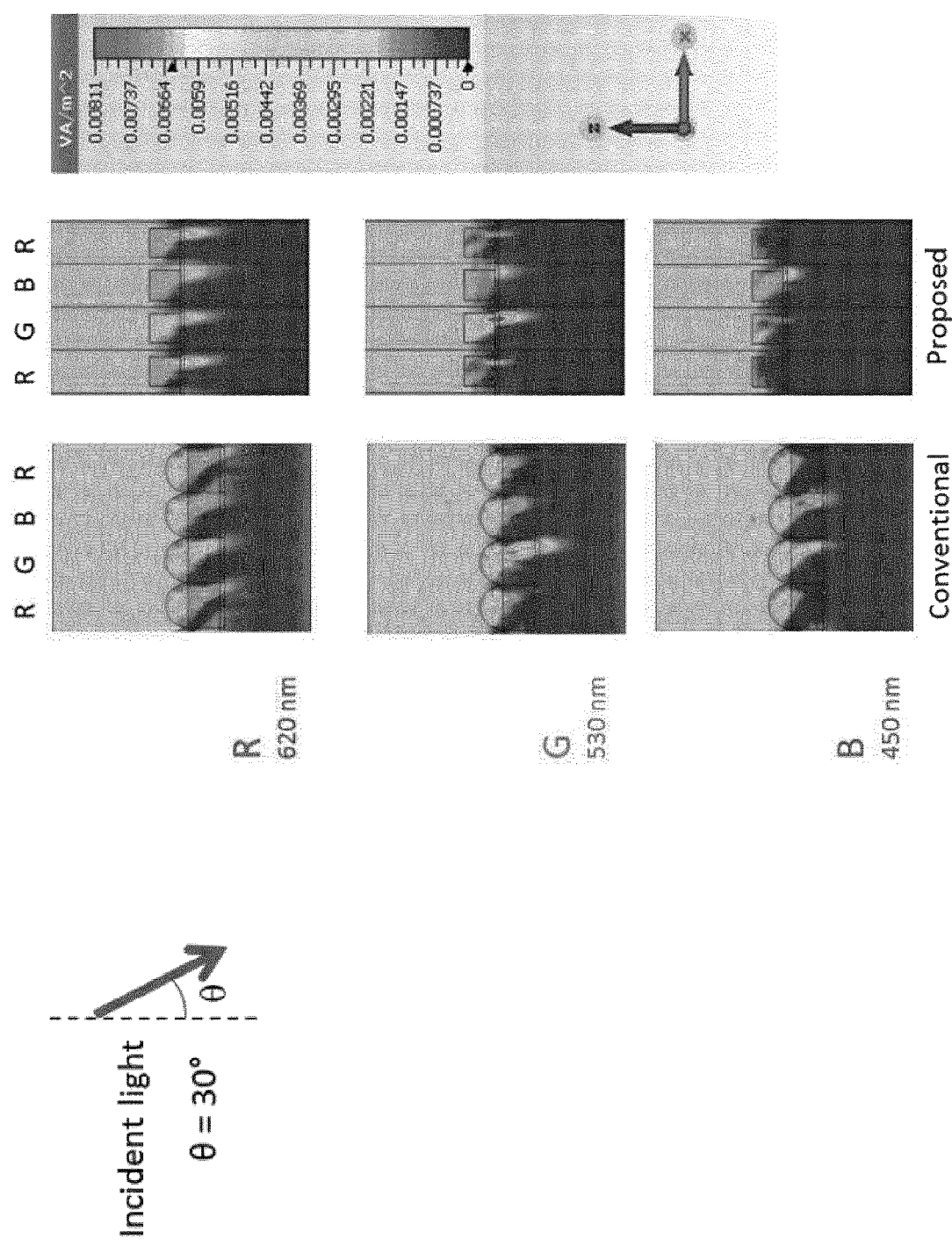
FIG. 13 presents a comparison of the power flow between conventional pixels and pixels according to one embodiment of the disclosure.

FIG. 13 presents a comparison of the power flow between conventional pixels and pixels according to one embodiment of the disclosure.

More precisely, FIG. 13 shows the power flow in the conventional structure and the proposed structure with similar geometrical dimensions. The incident light has 30° tilt respective to the normal. Spectral crosstalk is visible in both cases. Leakage of the power flow from one pixel to the neighboring pixel (optical crosstalk) is clearly visible in the conventional structure while the proposed structure shows a better performance.

Figure 14:
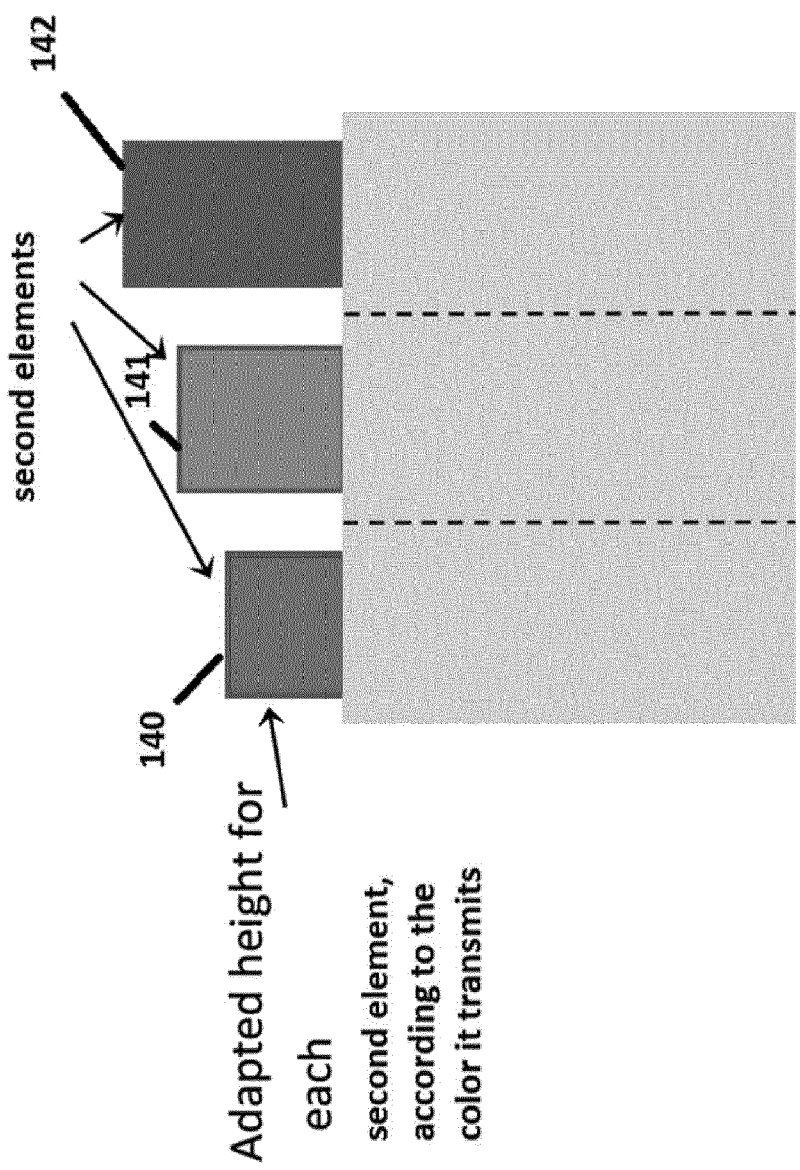
FIG. 14 presents another embodiment of the disclosure for which the height of the second elements in a pixel is defined according to the colors it can filter.

FIG. 14 presents another embodiment of the disclosure for which the height of the second elements in a pixel is defined according to the colors it can filter.

For example, in FIG. 14, the height of the second element referenced 140 only transmits the red color. The height of the second element referenced 141 only transmits the green color. At last, the height of the second element referenced 142 only transmits the blue color.

Figure 15:
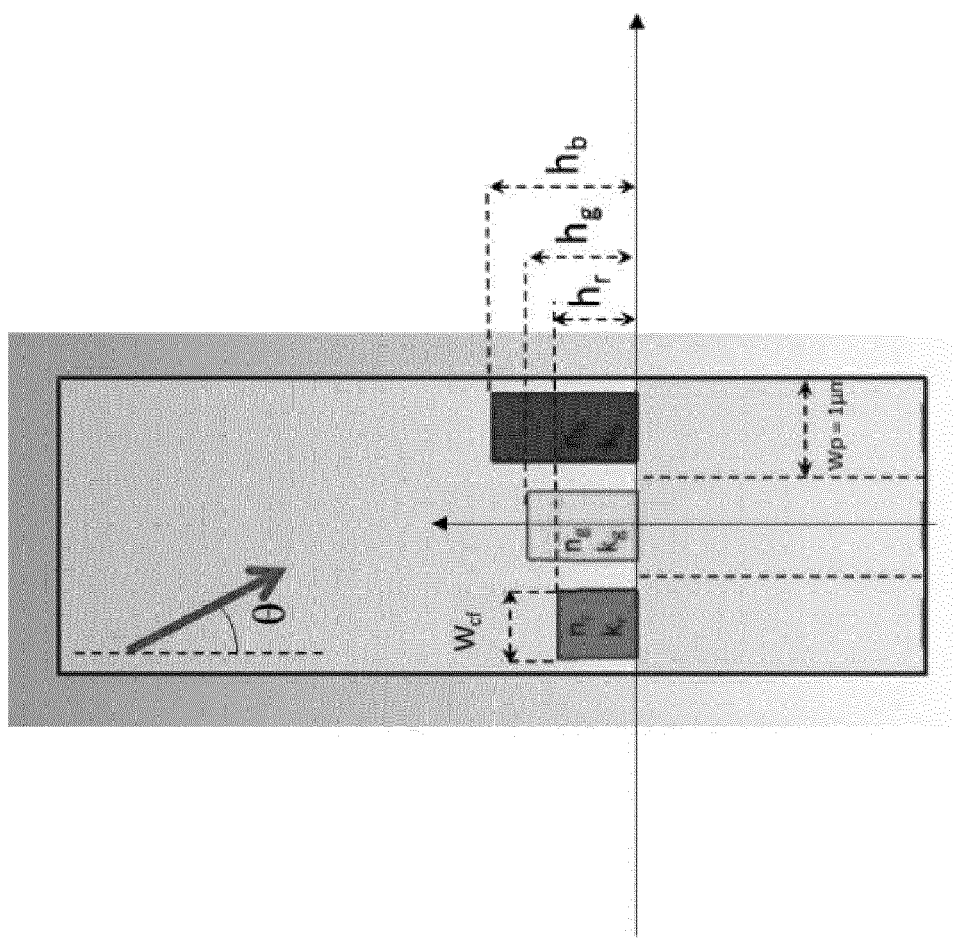
FIG. 15 presents another embodiment of the disclosure for which the width and the height of the second elements in a pixel are defined according to the colors it can filter.

FIG. 15 presents another embodiment of the disclosure for which the height of the second elements in a pixel are defined according to the colors it can filter.

More precisely, according to simulations, it appears that it can be interesting to design an image sensor wherein the second element of a pixel has a height which is dependent of the color filtering properties. For example, the height of a second element that can transmit only the red color is noted $h_r$, the height of a second element that can transmit only the green color is noted $h_g$ and the height of a second element that can transmit only the red color is noted $h_b$. It should be noted that the width of the second elements affects the aperture size and focusing properties rather than the filtering functionality.

In one embodiment of the disclosure, we have the following relationship which is established: $h_b > h_g > h_r$. Other relationships can occur depending on the dispersion of the color filter materials used for different colors.

For instance, with constant values of k, one may expect the opposite relation, e.g. nearly equal height in terms of the corresponding wavelength that would lead to a smallest second element that can substantially only transmits blue color, and a largest second element that can substantially only transmits red color.

More precisely, other relationships concerning the height of the second elements can be established based on the absorption properties of the light filtering material, or for other color bands.

Figure 16:
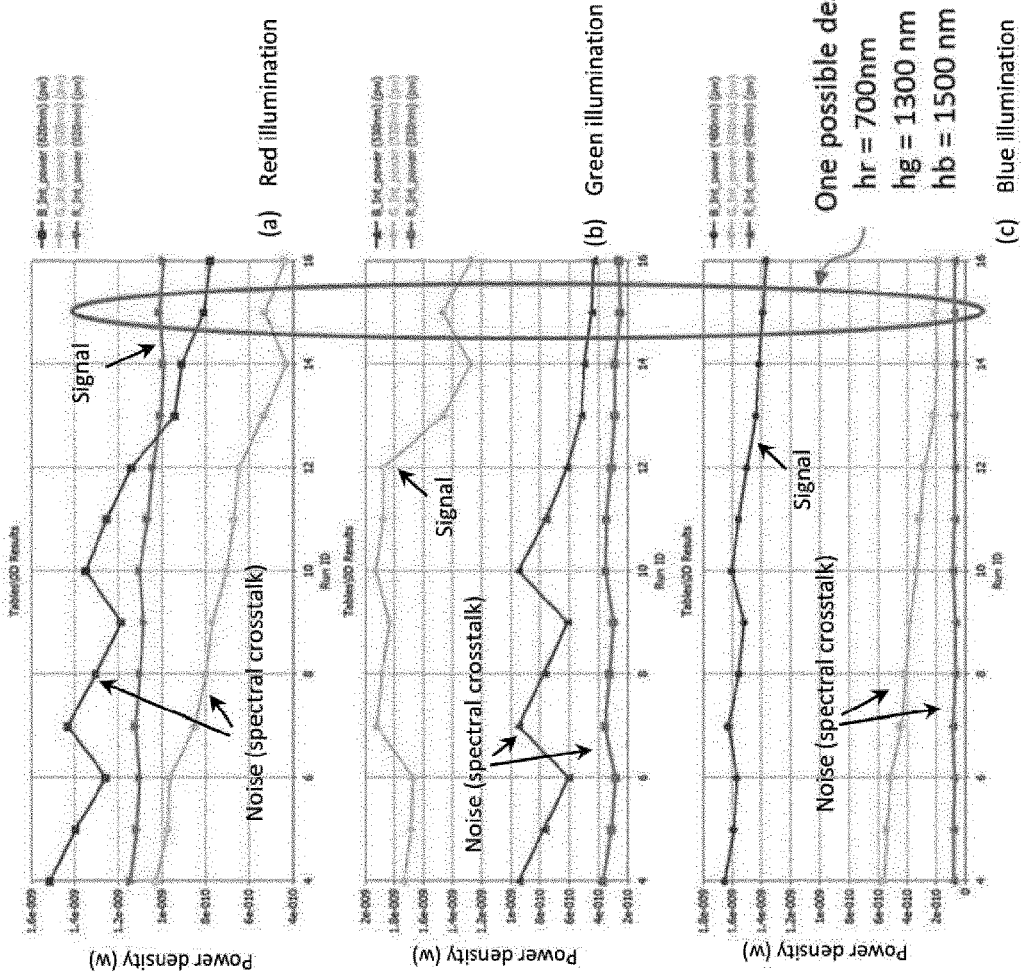
FIG. 16 presents an optimization process that improves the spectral crosstalk.

FIG. 16 presents an optimization process that improves the spectral crosstalk.

More precisely, FIG. 16 illustrates an optimization process for improving the spectral crosstalk and so the overall performance of the color filters of the second elements, by choosing the proper thickness for each color filter material. The thickness $h_r$ is kept constant at 700 nm, while the thickness of $h_g$ and $h_b$ are varied between 700 to 1500 nm. A design with $h_r=700$ nm, $h_g=1300$ nm and $h_b=1500$ nm is marked in FIG. 16, and such embodiment of the disclosure provides better color separation compared to other combinations, and consequently it reduced the spectral crosstalk. Some simulations have been done for red, green and blue illumination cases and each of the graphs shows the light power density that reaches to the photodiode. For example, FIG. 16(a) shows the filtering performance of the red, green and blue color filters under red illumination.

Figure 17:
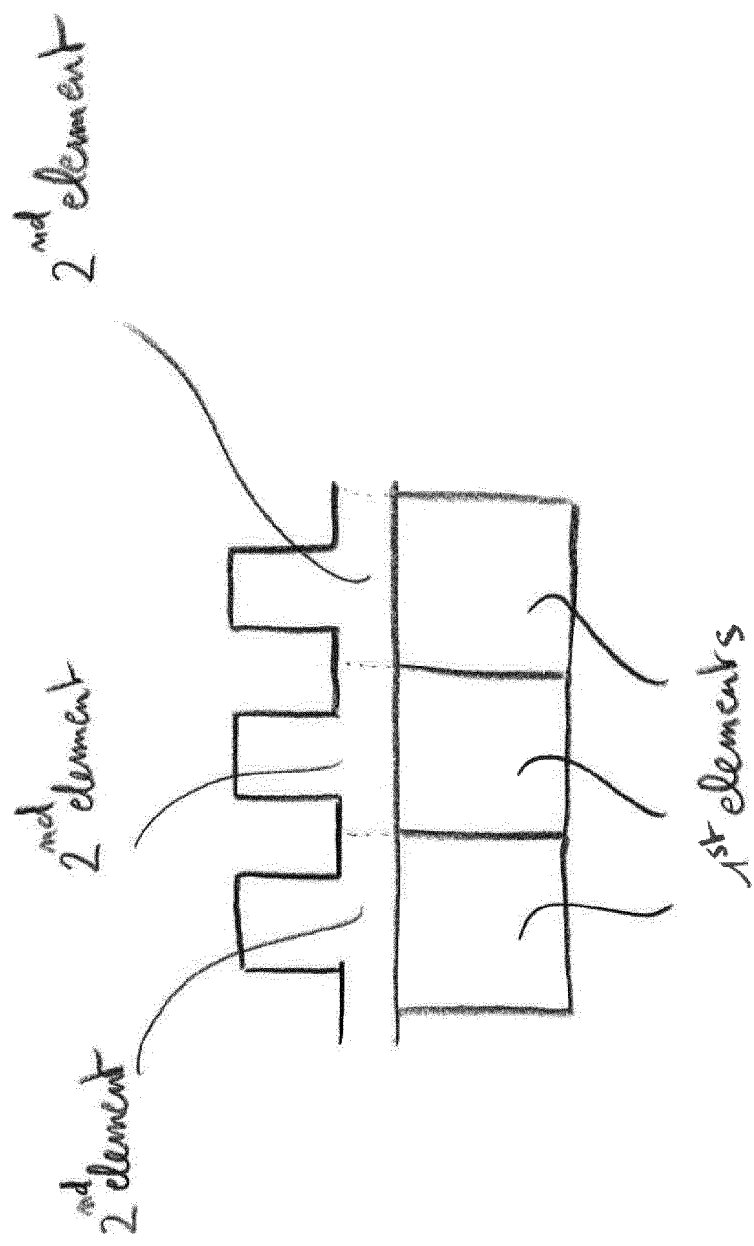
FIG. 17 presents another embodiment of the disclosure, wherein the second elements of pixels are partially put side by side, and a gap is still present.

FIG. 17 presents another embodiment of the disclosure, wherein the second elements of pixels are partially put side by side, and a gap is still present.

It should be noted that such embodiment can also be combined with the teachings of the previous described embodiments.

The invention claimed is:

1. An image sensor comprising a set of pixels, wherein each pixel of the set comprises a first element and a second element, the first element comprising a photodiode module unit having a planar surface, and the second element being an element for filtering color and focusing incident light into the first element, and wherein the image sensor comprises at least two consecutive pixels from the set of pixels, for which first elements are put side by side, and wherein the image sensor comprises a gap between second elements of the at least two consecutive pixels, and wherein each second element has a height that depends on which color is transmitted by the second element and dispersion properties of the material of the second element, wherein each second element extends away from the planar surface of the photodiode module unit by the height.

2. The image sensor according to claim 1, wherein each second element is made of a dielectric material with a complex refractive index of the form of n+jk, which is wavelength dependent, where n is a real part of the complex refractive index of the second element and k is an imaginary part of the complex refractive index of the second element.

3. The image sensor according to claim 1, wherein each second element substantially only transmits one color among red, green, and blue colors.

4. The image sensor according to claim 1, wherein each first element is positioned on a planar layer.

5. The image sensor according to claim 1, wherein each first element is positioned on a curved layer.

6. The image sensor according to claim 1, wherein the gap has a size up to 700 nm.

7. The image sensor according to claim 1, wherein each second element comprises a dielectric structure comprising color absorptive dyes that have dispersive properties in a wavelength of interest.

8. The image sensor according to claim 7, wherein the dielectric structure has a shape selected from a group consisting of a cylinder, a cuboid, a prism, a truncated pyramid, and a truncated cone.

9. The image sensor according to claim 1, wherein the width of the photodiode module unit is around 1000 nm, and the height of a second element is around $h_r=700$ nm, when the second element substantially only transmits a red color, or is around $h_g=1300$ nm when the second element substantially only transmits the green color or is around $h_b$=1500 nm when the second element substantially only transmits a blue color, and wherein each second element is made of a dielectric material with a complex refractive index of the form of n+jk, a value of n and k being selected from the following table:

| n (real part of the complex refractive index of a second element) | k (imaginary part of the complex refractive index of a second element) |
|---|---|
| 1.4 | 0.009 |
| 1.27 | 0.053 |
| 1.4 | 0.073 |
| 1.72 | 0.185 |
| 1.65 | 0.004 |
| 1.53 | 0.079 |
| 1.63 | 0.265 |
| 1.82 | 0.158 |
| 1.7 | 0.028 |
| 4.61 | 0.185 |
| 4.08 | 0.110 |
| 3.78 | 0.095 |
| 2.04 | 0. |

10. The image sensor according to claim 1, wherein a width of a second element is between 700 nm and 850 nm.

11. The image sensor according to claim 1, wherein the second elements of the at least two consecutive pixels are at least partially put side by side.

12. The image sensor according to claim 1, wherein the height of each second element is based on absorption properties of light filtering material of the second element.

13. The image sensor according to claim 1, wherein a width of the second elements affects an aperture size and focusing properties of the image sensor.

14. The image sensor according to claim 1, wherein a width of the second element is optimized for a wavelength of which color is transmitted.

15. The image sensor according to claim 1, wherein the gap between second elements of the at least two consecutive pixels prevents leakage of light through an optical stack in which the image sensor is disposed.

16. The image sensor according to claim 1, wherein the gap between second elements of the at least two consecutive pixels and heights of the second elements are configured to reduce crosstalk effect.

17. An image sensor comprising a set of pixels, wherein each pixel of the set comprises a first element and a second element, the first element comprising a photodiode module unit having a planar surface, and the second element being an element for filtering color and focusing incident light into the first element; and wherein the image sensor comprises at least two consecutive pixels from the set of pixels, for which first elements are put side by side, and wherein the image sensor comprises a gap between a first second element and a second second element of the at least two consecutive pixels, and wherein each second element has a height that depends on which color is transmitted by the second element and dispersion properties of the material of the second element, wherein each second element extends away from the planar surface of the photodiode module unit by the height, wherein the gap between second elements of the at least two consecutive pixels and heights of the second elements are configured to reduce crosstalk effect, wherein the first second element transmits a first color and the second second element transmits a second color different from the first color.

18. The image sensor according to claim 17, wherein the gap between the first second element and the second second element of the at least two consecutive pixels prevents leakage of light through an optical stack in which the image sensor is disposed.

* * * * *